(12) United States Patent
Sandhu et al.

(10) Patent No.: US 8,093,658 B2
(45) Date of Patent: Jan. 10, 2012

(54) ELECTRONIC DEVICE WITH ASYMMETRIC GATE STRAIN

(75) Inventors: Gurtej S. Sandhu, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/697,991

(22) Filed: Feb. 1, 2010

(65) Prior Publication Data

US 2010/0133612 A1 Jun. 3, 2010

Related U.S. Application Data

(62) Division of application No. 11/315,031, filed on Dec. 22, 2005, now Pat. No. 7,656,049.

(51) Int. Cl.
H01L 29/76 (2006.01)

(52) U.S. Cl. ........ 257/368; 257/346; 257/389; 257/900; 257/E29.134; 257/E29.152

(58) Field of Classification Search ................. 257/288, 257/346, 368, 389, 900, E29.134, E29.139, 257/E29.15, E29.152
See application file for complete search history.

(56) References Cited

U.S. PATENT DOCUMENTS

| | | |
|---|---|---|
| 5,741,737 A | 4/1998 | Kachelmeier |
| 6,503,833 B1 | 1/2003 | Ajmera et al. |
| 6,583,000 B1 | 6/2003 | Hsu et al. |
| 6,593,191 B2 | 7/2003 | Fitzgerald |
| 6,774,015 B1 | 8/2004 | Cohen et al. |
| 6,787,423 B1 | 9/2004 | Xiang |
| 6,825,086 B2 | 11/2004 | Lee et al. |
| 6,893,936 B1 | 5/2005 | Chen et al. |
| 6,903,384 B2 | 6/2005 | Hsu et al. |
| 6,955,952 B2 | 10/2005 | Yeo et al. |
| 6,963,078 B2 | 11/2005 | Chu |
| 6,982,208 B2 | 1/2006 | Lee et al. |
| 6,987,037 B2 | 1/2006 | Forbes |
| 7,033,893 B1 | 4/2006 | Xiang |
| 7,060,632 B2 | 6/2006 | Fitzgerald et al. |
| 7,078,742 B2 | 7/2006 | Lin et al. |
| 7,084,460 B2 | 8/2006 | Chen et al. |
| 7,091,522 B2 | 8/2006 | Lee et al. |
| 7,112,495 B2 | 9/2006 | Ko et al. |
| 7,132,349 B2 | 11/2006 | Kim et al. |

(Continued)

FOREIGN PATENT DOCUMENTS

DE 19703971 2/1998

(Continued)

OTHER PUBLICATIONS

"Applying Mechanical Stress to Improve MOS Semiconductor Performance", *IBM Technical Disclosure Bulletin*, IBM Corp, 30(9), (Feb. 1, 1988), 330-331.

(Continued)

*Primary Examiner* — Matthew E Warren
(74) *Attorney, Agent, or Firm* — Schwegman, Lundberg & Woessner, P.A.

(57) ABSTRACT

The use of strained gate electrodes in integrated circuits results in a transistor having improved carrier mobility, improved drive characteristics, and reduced source drain junction leakage. The gate electrode strain can be obtained through non symmetric placement of stress inducing structures as part of the gate electrode.

11 Claims, 6 Drawing Sheets

U.S. PATENT DOCUMENTS

| | | |
|---|---|---|
| 7,656,049 B2 | 2/2010 | Sandhu et al. |
| 2002/0145166 A1* | 10/2002 | Kachelmeier ............... 257/368 |
| 2003/0049893 A1 | 3/2003 | Currie et al. |
| 2003/0052333 A1* | 3/2003 | Mistry ........................ 257/192 |
| 2003/0116781 A1 | 6/2003 | Ohuchi |
| 2004/0113217 A1 | 6/2004 | Chidambarrao et al. |
| 2004/0178406 A1 | 9/2004 | Chu |
| 2004/0232422 A1 | 11/2004 | Forbes |
| 2005/0035404 A1* | 2/2005 | Yu et al. ...................... 257/336 |
| 2005/0142768 A1 | 6/2005 | Lindert et al. |
| 2005/0145919 A1* | 7/2005 | Chang et al. ................. 257/314 |
| 2005/0156268 A1 | 7/2005 | Chu |
| 2005/0285097 A1 | 12/2005 | Shang et al. |
| 2006/0170016 A1 | 8/2006 | Mathew et al. |
| 2006/0172502 A1 | 8/2006 | Chidambaram |
| 2006/0199310 A1 | 9/2006 | Nakabayashi et al. |
| 2006/0258123 A1 | 11/2006 | Forbes |
| 2007/0145430 A1 | 6/2007 | Sandhu et al. |

FOREIGN PATENT DOCUMENTS

| | | |
|---|---|---|
| DE | 102004063139 | 12/2005 |
| EP | 0675544 A1 | 10/1995 |
| EP | 0817278 A2 | 1/1998 |
| WO | WO-2007075755 A2 | 7/2007 |
| WO | WO-2007075755 A3 | 7/2007 |

OTHER PUBLICATIONS

Ootsuka, F., et al., "A Highly dense, High-Performance 130nm Mode CMOS Technology for Large Scale System-on-a-chip Applications", *International Electron Devices Meeting 2000. IEDM. Technical Digest*, (Dec. 10, 2000), 575-578.

* cited by examiner

ELECTRONIC DEVICE WITH ASYMMETRIC GATE STRAIN

RELATED APPLICATION

This application is a divisional application of U.S. application Ser. No. 11/315,031 filed on 22 Dec. 2005, now U.S. Pat. No. 7,656,049, which application is incorporated herein by reference in its entirety.

TECHNICAL FIELD

This application relates generally to semiconductor devices and device fabrication and, more particularly, to the formation of CMOS gate electrodes having asymmetrical strain.

BACKGROUND

The semiconductor device industry has a market driven need to reduce the size, cost and power consumption of integrated circuits (ICs), while increasing IC operating speed. One method of improving IC performance while reducing cost and power is to reduce the size of each of the individual transistors in the IC. As a result, virtually all electronic devices are driven to reduce or shrink the transistor size, known as scaling, including memory devices such as dynamic random access memory (DRAM), static random access memory (SRAM), and logic devices such as personal computers, laptop computers, personal digital assistants (PDAs), and other battery powered mobile devices such as cellular telephones. As the dimensions of the electronic devices are reduced, the voltage used to operate the individual logic and memory devices must be reduced for reliability reasons associated with the thinner gate dielectric thickness. An effect of reducing electronic device dimension includes increased gate dielectric leakage current and increase junction leakage. Even if the leakage currents remain the same, they become a larger percentage of the reduced overall power consumption. The thinner gate dielectrics required by the smaller IC dimensions may also have problems with increased gate leakage current levels, and the shorter channel lengths of the smaller IC devices may have increased levels of substrate leakage. Thus, there is an industry wide problem in forming scaled transistors having reduced leakage with increase drive current capabilities.

One method used to address the need to increase the transistor drive is the use of strain engineered transistors. In particular, complementary metal oxide semiconductor (CMOS) transistors, which pair up a p type and an n type metal oxide semiconductor (MOS) transistor, to provide a very low power consumption logic gate device, have been strain engineered to increase the carrier mobility in the semiconductor material, and thus increase the drive potential of the transistors. However, the stress that is built into the transistor structure creates a strained region at both junctions of the transistor, and thus may increase even further the source/drain (S/D) leakage problem discussed above. The increase in the S/D leakage current may be a greater problem than the benefit of increased mobility and increase transistor drive.

Thus, there exists a need to improve the carrier mobility while not increasing the S/D leakage current of the individual transistors. This need is especially felt in the low power, high performance devices such as DRAMs, low power mobile devices, and input protection devices such as electro static discharge (ESD) devices with low breakdown (BV) voltages.

What is needed is a method to provide improved carrier mobility, with decreased S/D junction leakage, while not increasing the manufacturing complexity and cost.

DETAILED DESCRIPTION

Figure 1:
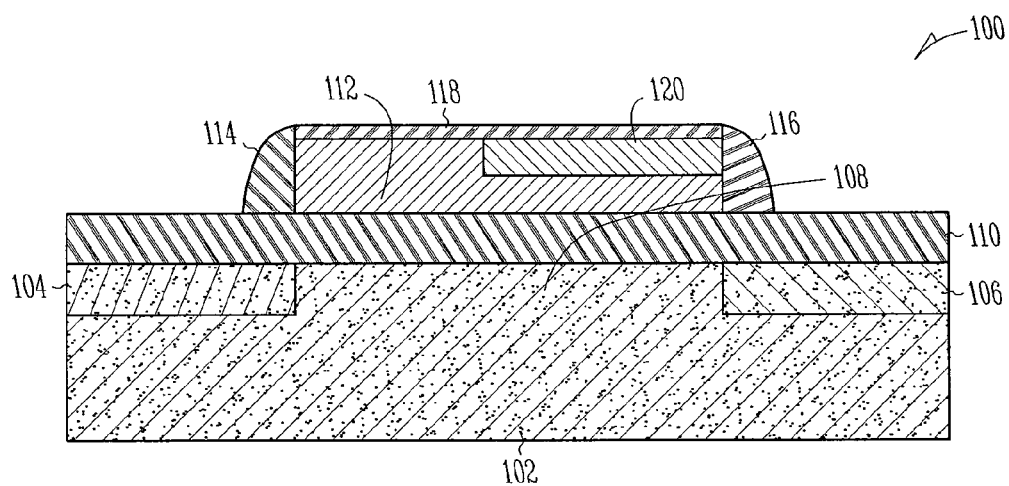
FIG. 1 illustrates an embodiment of a strained transistor in accordance with an illustrative embodiment.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure or a micro electro-mechanical (MEM) structure. The term substrate is understood to include semiconductor wafers. The term substrate is also used to refer to semiconductor structures during processing, and may include other semiconductor and non-semiconductor layers that have been fabricated thereupon. Both wafer and substrate include doped and undoped semiconductors, single crystalline, polycrystalline and amorphous semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors. The term high work function is understood to generally include all gate electrode materials having a higher work function than that of heavily doped polycrystalline silicon. The term high dielectric constant is understood to generally include all materials having a higher dielectric constant than the 3.9 value of silicon dioxide. The term refractory is understood to refer to any material that remains substantially unchanged during the thermal processing involved in forming transistor diffusion regions, such as the source and drain regions.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over"

and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

An embodiment includes a transistor including a semiconductor substrate having a first doping type, at least two diffused regions in the substrate having an opposite doping type forming a source region and a drain region, a channel region between the source and drain regions, a dielectric layer above the channel region, a gate electrode on the dielectric layer and over the channel region, extending to include a portion of the gate electrode over part of the source and drain region. The transistor has one of the portions of the gate electrode over one of the source and drain regions having an asymmetrical strain compared to the other part of the gate electrode. The strain may be formed by having dissimilar materials used for sidewall spacers, or by having the spacers formed under different conditions, or by forming the gate electrode with a removed section on one side, or by adding a different material to one side of the gate electrode, or by a combination of methods. Typical materials include polysilicon for the gate electrode, refractory metals for the different material to be added to the gate electrode, either in a trench formed in one side of the gate electrode, or attached to the top of the gate electrode, and silicon dioxide and silicon nitride for the sidewall spacers.

Other embodiments include a method of forming the transistors having an asymmetric strain, by forming a gate electrode having two dielectric spacers over a gate oxide over a substrate, removing one of the two dielectric spacers, replacing the removed dielectric spacer with a different dielectric spacer, and forming source and drain regions aligned with the two dielectric spacers. Another embodiment forms a photo resist mask to expose one side of the gate electrode, and to partially etch the exposed side to form a thinner layer. The etched portion may be filled by deposition of a different material.

A MOS transistor typically has a crystalline semiconductor substrate of a first conductivity or doping type, either p type for dopant materials that provide positive charge carriers, or n type for dopant materials that provide negative charge carriers. There are usually at least two regions of the substrate that are doped oppositely to the substrate to form two diodes, known as the source and the drain. Either one of the two diodes may be the source or the drain, since the device is symmetrical, and the use of the terms source and drain are only significant after the transistor is biased and in operation. Thus the usual practice is to refer to the source and drain diode regions as S/D regions, since the device is bidirectional. The substrate region between the S/D diodes is called the channel region, the distance between the S/D diodes is called the channel length, which affects the speed and drive capability of the transistor. The length of the S/D regions in the direction perpendicular to the channel length, but in the plane of the substrate, is called the transistor width, which also affects the drive capability of the transistor.

The channel region is controlled by a voltage supplied to a gate electrode disposed above, but not in direct electrical contact with, the channel region. The gate electrode may be electrically separated from the channel region by an insulator layer referred to as a gate oxide. The gate electrode affects the effective doping level of the channel region by attracting the minority carrier type towards the surface of the substrate, until the minority carrier outnumbers the majority carriers at or near the surface, thus temporarily inverting the doping type of the channel region and turning the transistor to the on state.

The amount of current the transistor can conduct when in the on state, and the rate at which the transistor can be turned off and on, depend upon numerous mutually interacting factors, including the mobility of the charge carrier, the width of the channel, the length of the channel, the doping level of the channel region, the thickness of the gate oxide, the dielectric constant of the gate oxide, the work function of the gate electrode material, and the electric field strength at the edges of the S/D regions.

Another transistor property of interest, particularly in low power applications such as mobile phones, mobile computers and personal digital assistants (PDAs), is power consumption. One method of reducing the operating power consumption of a particular device is to use what is known as complementary MOS (CMOS) devices that pair a NMOS transistor with a PMOS transistor so that the only time that the logic gate conducts large amounts of power is during the short interval when the logic state is changing from low to high, or vice versa. However, the PMOS devices use the positive charge carrier, which may be known as holes, to conduct current when in the on state, and are thus slower than NMOS devices, since holes have a lower mobility as compared to electrons. One factor affecting power consumption is what is known as junction leakage.

One method of increasing the amount of current the transistor can conduct when in the on state, also known as the transistor drive, is to increase the mobility of the charge carriers by straining the crystal of the substrate in the region around the S/D junctions with the channel region. However, the strain may cause increased power consumption by increasing the S/D junction leakage. Thus, while strain engineering the substrate may help with increasing the drive properties of the transistors, the strain may hurt the device by also increasing the leakage rate of the S/D junction that is reverse biased while the device is in an operational mode. What is needed is a device that has an asymmetrical engineered strain on opposite sides of the gate electrode to provide the improvement in transistor drive obtainable with a strained substrate, while preventing the concomitant increase in junction leakage current at one of the two S/D diffusion regions.

The asymmetrical strain may be engineered by applying stress elements in the transistor structure in an uneven way. Any type of stress mismatch between various elements in the device structure can be used to optimize the location and type of strain desired. For example, either compressive or tensile strain layers on either the top or one of the sides of the gate electrode may result in an asymmetrical strain on the transistor. Specific stress configurations may be obtained by adjusting the deposition temperature or pressure of a chemical vapor deposition (CVD) reaction, for example silicon nitride deposition. Plasma CVD, low pressure CVD (LPCVD), sputtering, reactive sputtering, electron beam evaporation, or chemical reactions may also be used to form layers that have a stress mismatch. Mismatched layer thickness or non symmetrical geometric shapes may also result in an applied stress to the transistor structure. For example, a gate electrode having two different thicknesses over a single channel region may be in a stress free state at a particular operating temperature, but may form an asymmetrical strain, either compressive, tensile, or both, on the device at a different temperature due to the different amount of stress the different thicknesses of the gate electrode may be able to apply to the device. Several examples of methods to form asymmetrical devices will be provided in the illustrative embodiments provided, but other methods and structures will be apparent to one of ordinary skill in the art.

FIG. 1 illustrates an embodiment of a transistor device 100 having a structure that will apply stress to the substrate 102 in an asymmetrical way in which one of the S/D regions 104 and 106 will have an increase in the carrier mobility while the other region will not have a strain imposed that may increase the junction leakage to the channel region 108. In this illustrative embodiment, the gate dielectric or gate oxide 110 has a gate electrode 112 formed of a conductive refractory material such as doped polysilicon, tungsten, titanium, titanium nitride, titanium silicide or combinations of various refractory materials. The gate electrode 112 may also be what is known as a gate stack, formed of various layers of different materials having desired work functions and conductivities.

This illustrative embodiment has gate sidewall spacers 114 and 116, which may be formed of a variety of insulating materials such as silicon dioxide, silicon nitride, silicon carbide, or other insulating materials, but the invention is not so limited, and may be applied to MOS transistors not having sidewall spacers, or to bipolar transistors. The sidewall spacers in the illustrative embodiment are used to prevent the S/D diffusions 104 and 106 from diffusing too far under the gate electrode 112, and thus minimize the parasitic gate to S/D capacitance. In this illustrative embodiment the sidewall spacers are both formed of the same material, at the same time, at the same conditions, for example CVD silicon dioxide. As a result of both spacers being formed of the same material under the same conditions, the strain applied to the substrate 102 is symmetrical. The sidewall spacers may be formed by a blanket deposition of the spacer material, which is then anisotropically etched to remove all of the material on horizontal surfaces such as the top of the gate 112 and the gate oxide 110, but leaving the thicker material formed along the vertical walls of the sides of the gate electrode 112 to form the spacers.

The sidewall spacers may also have the property of protecting the gate electrode 112 from contamination during processing, and from decomposition during the thermal processing that may typically occur during the formation of the S/D regions and the remaining processing of the device of which the transistor 100 is part. There may be a top protective layer 118, typically formed of an insulative material such as those used to form the sidewall spacers. This layer 118 may also be a remaining portion of the sidewall spacers, or a diffusion barrier.

The gate electrode 112, as illustrated in this embodiment, may have a portion 120 removed from one side of the gate electrode, for example by photo masking and etching. Even by itself, such an uneven thickness of gate electrode may create an asymmetrical strain on the substrate 102, since the coefficient of thermal expansion (CTE) of the gate electrode, for example polysilicon, is different from that of the gate oxide 110, for example silicon dioxide, and the operating temperature of the transistor 100 is typically different from the deposition temperature of the gate electrode, typically by hundreds of degrees C. Since the strain due to mismatched layers was typically zero at the deposition temperature, and since the CTE values are different for the two different layers, then strain, either compressive or tensile, is imposed on the structure when the device is removed from the deposition system and cooled. The imposed strain is asymmetrical since the amount of stress that the thicker side of the gate electrode 112 can impose may be greater than the amount of stress from the thinner, more flexible, side of the gate electrode. More typically, the removed portion of the gate electrode 112 would be replaced with a different material having a different CTE and stress configuration. As an example, the conductive polysilicon 112 might be partially replaced by an insulator such as silicon nitride at location 120. In another embodiment, the tungsten electrode may have a portion removed and replaced with titanium, or other conductive material. Any two dissimilar materials may be used, or the same material formed under different conditions may be used to create a stress mismatch. This mismatch may produce the desired asymmetrical strain on the substrate 102.

Figure 2:
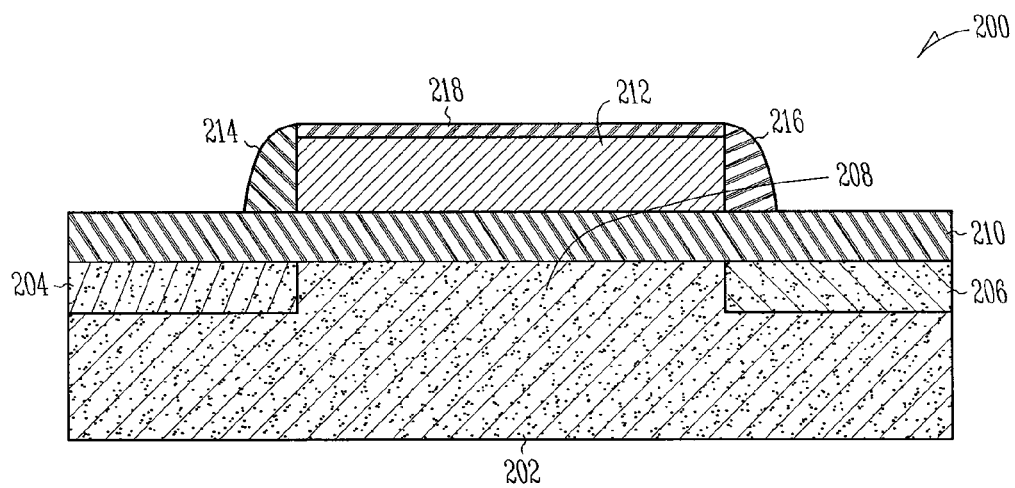
FIG. 2 illustrates another embodiment of a strained transistor in accordance with another illustrative embodiment.

FIG. 2 illustrates a second embodiment of a device 200 having asymmetrical strain on the substrate 202. In this embodiment the asymmetrical strain is created by the use of dissimilar materials in the gate sidewalls 214 and 216. For example, the sidewall 214 may be formed of silicon nitride, while the sidewall 216 may be formed of silicon oxide. The different materials will each provide a characteristic stress condition which will typically be different from each other, thus resulting in asymmetrical strain on the device 200 channel region 208. In the alternative, the two sidewalls 214 and 216 may be formed of the same material, but at different times or at different deposition conditions.

An alternative method may be to create a different internal structure to one of the two sidewall structures, for example by ion implantation into one sidewall of heavy metals such as arsenic. The amorphous structure of one of the sidewalls may provide a different stress condition from the partially crystallized structure of the other side. Another alternative structure might be to have one of the sidewalls 214 and 216 formed of several different layers, for example sidewall 214 might be formed of a silicon dioxide layer covered by a silicon nitride layer, while sidewall 216 might be formed of a single silicon dioxide layer. Such a mismatch of different material layers on opposite sides of the gate electrode 212 creates the desired asymmetrical strain.

Figure 3A:
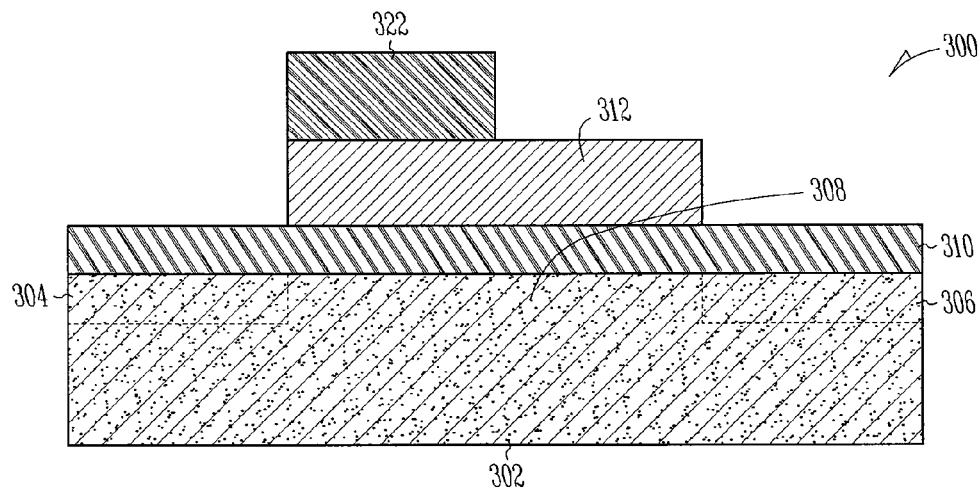
FIGS. 3A-3C illustrate a method of forming an embodiment of a strained transistor having the structure of the illustrative embodiment of FIG. 1.

FIG. 3A illustrates an intermediate step in an illustrative method for forming the first illustrative device discussed previously. The illustrative transistor 300 has a substrate 302 with two S/D regions 304 and 306, which are shown in this figure for simplicity of explanation, since the S/D regions are typically formed after the gate electrode 312 is fully formed and the sidewall spacers are present. The gate electrode 312 extends over the channel region 308 to about the edge of the S/D regions 304 and 306. In this illustrative method, the gate electrode 312 has a patterned photo resist layer 322 formed over a portion of the gate.

Figure 3B:
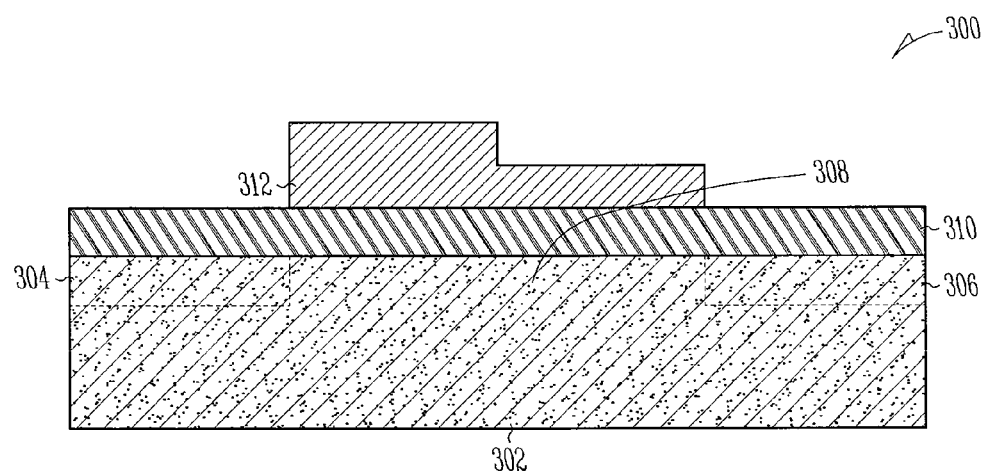

FIG. 3B illustrates the partial removal of an exposed portion of the gate electrode 312 by means of a timed etch. The photo resist layer 322 has been removed after completion of the etch. An alternative method of forming the illustrated step may be to deposit the gate electrode 312 as a stacked electrode with a first material having a different etch rate than a second material deposited over the first material. In this illustrative embodiment, the etch process would not have to be a timed etch, but the etch process would have to be selected to have what is known as a large etch selectivity for the second (or top) material over the first (or bottom) material to form the illustrated step.

Another alternative formation method would be to use the same material for the entire gate electrode 312, but insert a conductive etch stop material, such as titanium nitride, between the deposition of the bottom layer and the deposition of the top layer. In this illustrative method, the etch process would have to be selected to have a large etch selectivity over the etch stop material.

Figure 3C:
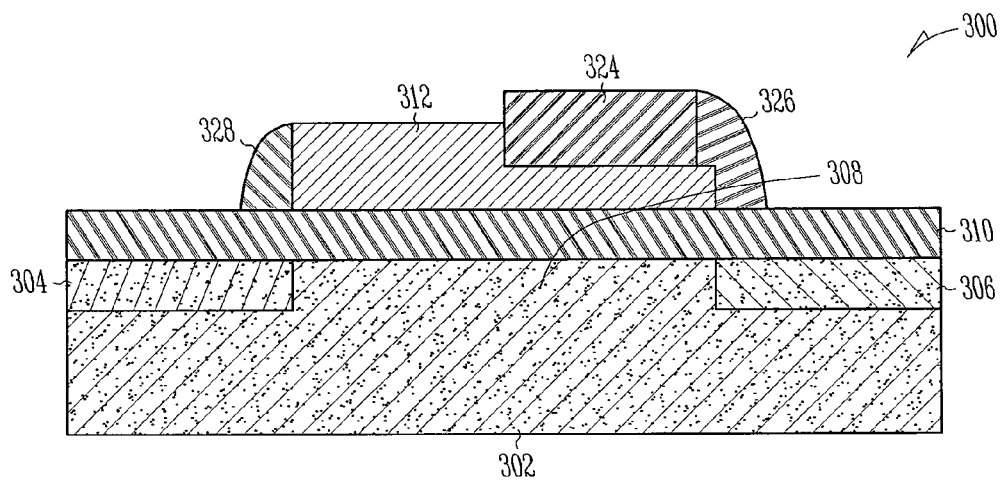

FIG. 3C illustrates a method of filling in the step formed in the gate electrode 312 with a different material 324. Such a material may be formed by means of what is known as a lift off process, or by a deposit, photo mask and etch process, or by use of an oversized mask and etch, followed by chemical mechanical polishing (CMP) processing to remove the excess material 324 over the gate electrode 312. The illustrated material 324 is shown as having a final thickness that is greater than the height of the step cut in the gate electrode 312, but the invention is not so limited. The illustrated material 324 is shown as having a final width that is less than the width of the step cut in the gate electrode 312, resulting in an area of the thin portion of gate electrode 312 that is not covered by the material 324, but the invention is not so limited. The material 324 may have essentially any thickness and horizontal dimension, either greater than or less than the dimension of the cutout portion of gate electrode 312. The material 324 may be a conductive material or an insulative material. The use of a highly conductive material may be a benefit since it would reduce the gate resistance in the case that the gate electrode 312 is formed of doped polysilicon.

The illustrative embodiment shows two sidewall spacers 328 and 326, but the invention is not so limited, and there may be only a single sidewall spacer, or no sidewall spacers, or the sidewall spacers 326 and 328 may be formed of different materials, or of the same material, or the same material deposited under different conditions, or the sidewalls may each be formed of various combinations of materials. The desired asymmetric strain may be provided by the change in gate electrode 312 thickness from one S/D region 304 to the other S/D region 306, or by the different material 324 attached to the gate electrode 312, or by differences in the sidewall spacers 326 and 328, or by a combination of these stresses.

Figure 4A:
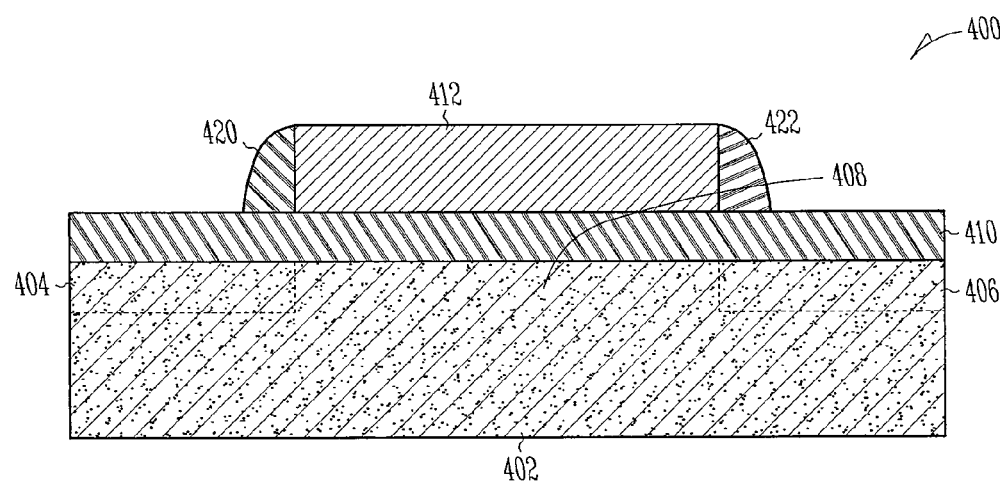
FIGS. 4A-D illustrate a method of forming an embodiment of a strained transistor having the structure of the illustrative embodiment of FIG. 2.

FIG. 4A illustrates an intermediate step in a second illustrative method for forming the second illustrative device discussed previously. The transistor 400 has two S/D regions 404 and 406, again shown in this figure for simplicity since the S/D regions would not yet be formed at this point in the process, separated by a channel region 408. The gate insulator or oxide 410, which may be formed of silicon dioxide, or of other insulating materials having a higher dielectric constant, extends at least over the channel region 408. The channel region is covered by a gate electrode 412, which extends over the channel 408 at least to a point over the edge of S/D regions 404 and 406. In this illustrative embodiment the gate electrode 412 has sidewall spacers 420 and 422.

Figure 4B:
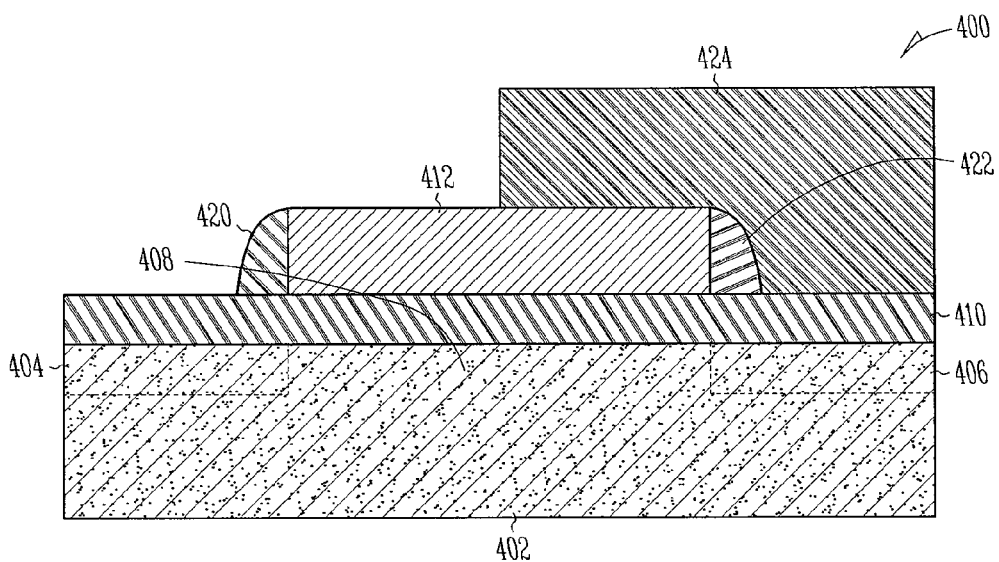

FIG. 4B shows the process with the sidewall spacer 422 covered by patterned photo resist 424. The photo resist layer 424 may be used to ion implant the spacer 420 with an ion to produce damage to change the stress state of the spacer 420. The photo resist layer 424, in this illustrative embodiment, is used to expose the spacer 420 to an etch process selected to attack the material of the spacer 420, for example CVD oxide, while not substantially attacking the material of the gate electrode, for example polysilicon, or of the substrate.

Figure 4C:
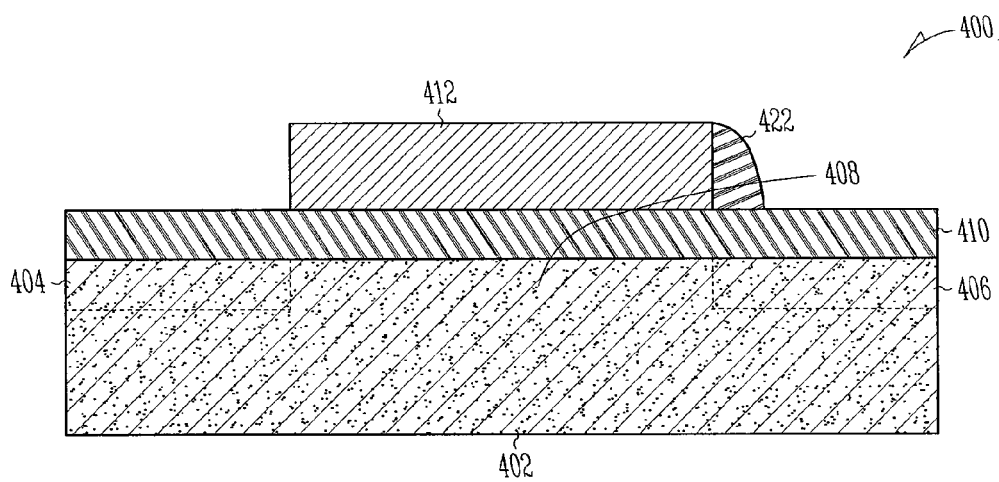

FIG. 4C shows the resulting structure after etch of the spacer 420 and the removal of the photo resist 424. The transistor 400 now has an asymmetric strain on the substrate 402 due to the presence of the spacer 422 on only one side of the gate electrode 412. Again note that the S/D regions 404 and 406 would not be present at this point in the process, and are shown for simplicity. The device could be left in this configuration, but the absence of a spacer on one side of the gate electrode would lead to a difference in the amount of overlap between the gate electrode 412 and the two S/D regions 404 and 406, since the S/D region on the side without the spacer would diffuse much farther under the gate electrode 412, resulting in an increase in parasitic capacitance.

Figure 4D:
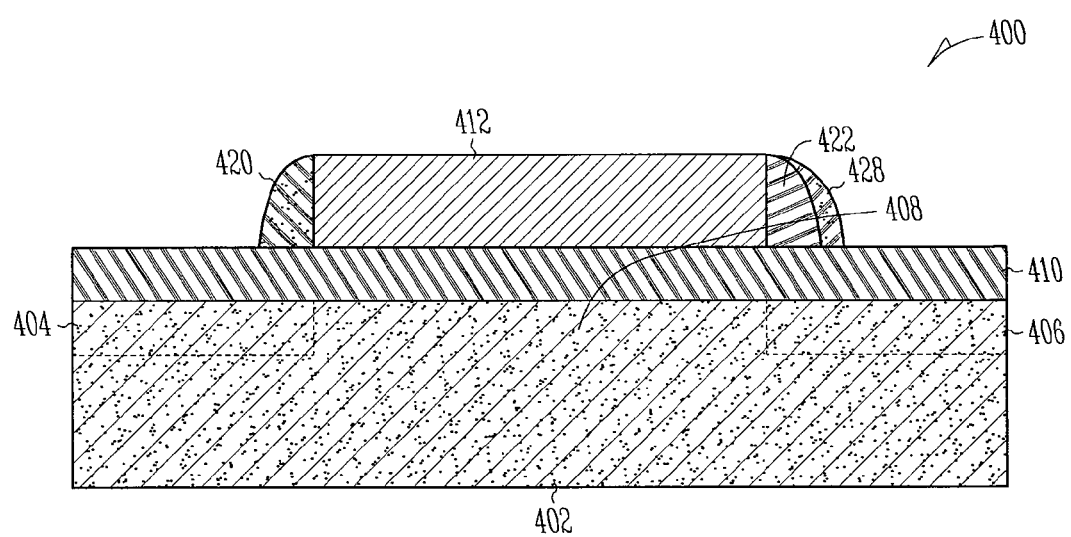

FIG. 4D illustrates the formation of another spacer 426, preferably formed of a different material, to replace removed spacer 420. A typical material used to form spacer 426 would include silicon nitride.

The material of spacer 426, which is preferably different from the material of spacer 422, may also cover spacer 422 with a new layer 428. The mismatch of the material combinations forming the spacers on the two sides of the electrode 412 will result in an asymmetric strain imposed on the device 400.

Any difference between the materials on different portions of the channel region 408, including thickness changes, material changes, spacer variations, or combinations of these factors, will result in an asymmetric strain. Proper positioning of the compressive or tensile stresses, and the magnitude of the imposed asymmetric strain may be used to improve the transistor drive, while not degrading the junction leakage.

Structures such as shown in FIG. 1, 2, 3 or 4 may be used in any integrated circuit or transistor devices, such as flash memory devices as well as other memory, logic or information handling devices and systems. Embodiments of these information handling devices include wireless systems, telecommunication systems, computers and integrated circuits.

Figure 5:
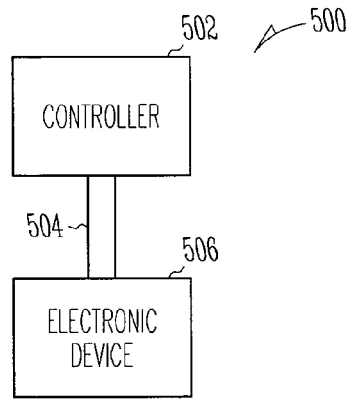
FIG. 5 is a block diagram of an electronic device in accordance with an embodiment of the invention.

FIG. 5 is a block diagram of a general electronic device in accordance with an embodiment of the invention with an electronic system 500 having one or more devices having selected portions of the circuits with devices having an asymmetric strain according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a portion of the device having asymmetric strained transistors as previously discussed herein. Electronic system 500 may include, but is not limited to, information handling devices, wireless systems, telecommunication systems, fiber optic systems, electro-optic systems, and computers.

Figure 6:
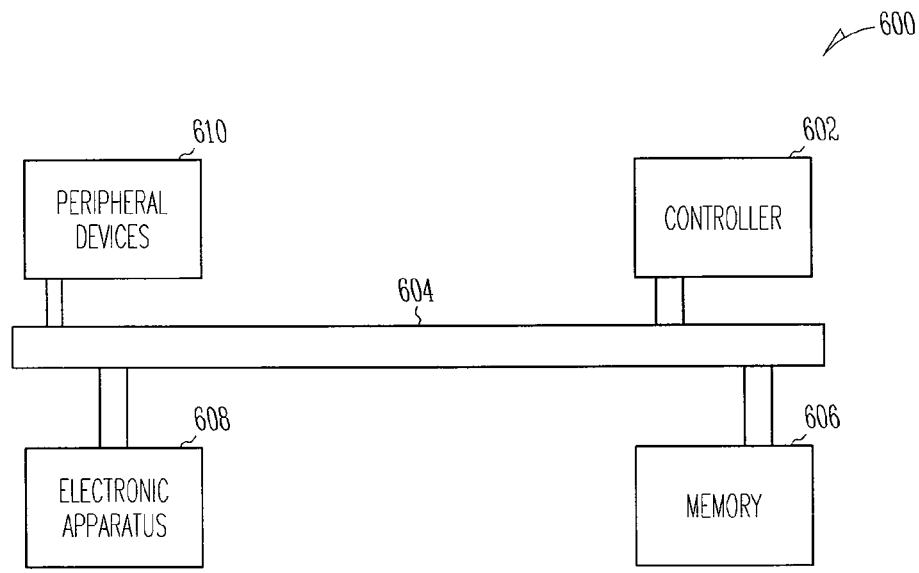
FIG. 6 is a diagram of an electronic system having devices in accordance with an embodiment of the invention.

FIG. 6 depicts a diagram of an embodiment of a system 600 having a controller 602 and a memory 606. Controller 602 and/or memory 606 include a portion of the circuit having asymmetric strained transistors for increase drive. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include transistors having an asymmetric strain in accordance with the disclosed embodiments. System 600 may include, but is not limited to, information handling devices, telecommunication systems, and computers. Peripheral devices 610 may include displays, additional memory, or other control devices operating with controller 602 and/or memory 606.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A transistor comprising:
a semiconductor substrate having a first doping type;
two diffused regions in the substrate having a doping type opposite of the substrate forming a source region and a drain region;
a channel region disposed between the source region and drain region;
a dielectric layer disposed above the channel region; and
a gate electrode disposed upon the dielectric layer substantially covering the channel region and having a first portion disposed above at least a portion of the source region and a second portion disposed above at least a portion of the drain region, the first portion having a material composition and the second portion including the material composition, the first portion of the gate electrode being thicker than the second portion of the gate electrode such that the material composition of the first portion and the second portion is configured as a step above the dielectric layer, the gate electrode having an applied stress condition that is different at the first portion as compared to the second portion, wherein the gate electrode includes material having an asymmetrical strain with respect to the first portion compared to the second portion based on the first portion having a composition in common with the second portion with the first portion formed under different conditions than the second portion.

2. The transistor of claim 1, wherein the transistor includes an additional layer on and contacting the second portion of the gate electrode, the additional layer of a material different from the material composition forming the step of the gate electrode.

3. The transistor of claim 2, wherein the additional layer comprises one of a refractory metal, a silicide, a polycide, or combinations thereof.

4. The transistor of claim 1, wherein the first portion of the gate electrode is ion implanted to form an amorphous layer.

5. A transistor comprising:
a semiconductor substrate having a first doping type;
two diffused regions in the substrate having a doping type opposite of the substrate forming a source region and a drain region;
a channel region disposed between the source region and drain region;
a dielectric layer disposed above the channel region; and
a gate electrode disposed upon the dielectric layer substantially covering the channel region and having a first portion disposed above at least a portion of the source region and a second portion disposed above at least a portion of the drain region, the first portion having a material composition and the second portion including the material composition, the first portion of the gate electrode being thicker than the second portion of the gate electrode such that the material composition of the first portion and the second portion are configured as a step above the dielectric layer, the gate electrode having an applied stress condition that is different at the first portion as compared to the second portion; and
an additional layer on and contacting the second portion of the gate electrode, the additional layer of a material different from the material composition forming the step of the gate electrode, wherein the additional layer comprises a dielectric material.

6. An electronic device comprising:
a substrate;
a source region and a drain region of a transistor disposed in the substrate;
a channel region disposed between the source region and drain region;
a dielectric disposed above the channel region; and
a gate electrode disposed upon the dielectric above the channel region, the gate electrode configured with a step above the dielectric, the gate electrode having a stress condition in a thicker side of the step that is different from a stress condition in a thinner side of the step, wherein the gate electrode includes material having an asymmetrical strain with respect to the thicker side compared to the thinner side based on the gate electrode including dissimilar material.

7. The electronic device of claim 6, wherein the gate electrode includes multiple conductive materials.

8. The electronic device of claim 6, wherein the gate electrode includes a conductive material disposed on the thinner side of the step, the conductive material different from material forming the step.

9. The electronic device of claim 8, wherein the conductive material disposed on the thinner side of the step includes titanium and the step includes tungsten.

10. The electronic device of claim 6, wherein the gate electrode includes a conductive refractory material or a combination of conductive refractory materials.

11. An electronic device comprising:
a substrate;
a source region and a drain region of a transistor disposed in the substrate;
a channel region disposed between the source region and drain region;
a dielectric disposed above the channel region; and
a gate electrode disposed upon the dielectric above the channel region, the gate electrode configured with a step above the dielectric, the gate electrode having a stress condition in a thicker side of the step that is different from a stress condition in a thinner side of the step, wherein the gate electrode includes material having an asymmetrical strain with respect to the thicker side compared to the thinner side based on the gate electrode including dissimilar material or based on the thicker side having a composition in common with the thinner side with the thicker side formed under different conditions than the thinner side.

\* \* \* \* \*